US008883646B2

(12) United States Patent
Huang et al.

(10) Patent No.: US 8,883,646 B2
(45) Date of Patent: Nov. 11, 2014

(54) SELF-ASSEMBLED MONOLAYER FOR PATTERN FORMATION (75) Inventors: Tsung-Min Huang, Taichung (TW); Chung-Ju Lee, Hsinchu (TW); Chien-Hua Huang, Pingzhen (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/567,250

(22) Filed: Aug. 6, 2012

(65) Prior Publication Data

US 2014/0038428 A1 Feb. 6, 2014

(51) Int. Cl.
*H01L 21/311* (2006.01)
(52) U.S. Cl.
USPC ............ 438/696; 257/E21.038; 257/E21.039; 257/E21.249; 257/E21.257; 257/E21.259; 257/E21.582; 430/119.2; 430/330; 430/331; 438/694; 438/703; 438/758; 438/780
(58) Field of Classification Search
USPC ................... 257/E21.038, E21.039, E21.249, 257/E21.257, E21.259, E21.582; 430/119.2, 330, 331; 438/694, 696, 438/703, 758, 780
See application file for complete search history.

(56) References Cited

U.S. PATENT DOCUMENTS

| 2006/0281266 A1* | 12/2006 | Wells | 438/299 |
| 2008/0122125 A1* | 5/2008 | Zhou | 257/797 |
| 2008/0274413 A1* | 11/2008 | Millward | 430/5 |
| 2009/0191713 A1* | 7/2009 | Yoon et al. | 438/703 |

* cited by examiner

*Primary Examiner* — Asok K Sarkar
(74) *Attorney, Agent, or Firm* — Eschweiler & Associates, LLC (57) ABSTRACT

The present disclosure is directed to a process for the fabrication of a semiconductor device. In some embodiments the semiconductor device comprises a patterned surface. The pattern can be formed from a self-assembled monolayer. The disclosed process provides self-assembled monolayers which can be deposited quickly, thereby increasing production throughput and decreasing cost, as well as providing a pattern having substantially uniform shape.

20 Claims, 6 Drawing Sheets

SELF-ASSEMBLED MONOLAYER FOR PATTERN FORMATION

BACKGROUND

A continuing trend in semiconductor technology is to build integrated circuits with more and/or faster semiconductor devices. As is often the case, however, as the devices shrink in size from one generation to the next, some of the existing fabrication techniques are not precise enough to be used in fabricating the next generation of integrated circuit devices. For example, spacers are used in conventional semiconductor devices to provide alignment of the source and drain regions to the gates in transistors. Minor differences in the uniformity and shape of the spacers can alter the operational characteristics of the device.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Features, such as conductive lines, are conventionally formed using a process in which a pattern defining the features is first formed in a temporary layer over a semiconductor substrate and subsequently transferred to the substrate using conventional etching chemistries. Photolithography is commonly used to pattern such features within a photodefinable (or photoresist) layer. In photolithography, a pattern of features is formed in the photodefinable layer using a process which includes directing light (or radiation) through a reticle having a pattern corresponding to the pattern of features to be formed in the substrate.

The sizes of features can be described by the concept of "pitch," which is defined as the distance between identical points in two neighboring features. These features are typically defined by spaces between adjacent features. Spaces are typically filled by a material, such as an insulator, to form "spacers". As a result, for regular patterns (e.g., in arrays), pitch can be viewed as the sum of the width of a feature and the width of the space on one side of the feature separating that feature from a neighboring feature. However, due to factors such as optics and light (or radiation) wavelength, photolithography techniques each have a minimum pitch below which a particular photolithographic technique cannot reliably form features. Consequently, the minimum pitch restriction of a given photolithographic technique is an impediment to further reduction in feature sizes.

Moreover, current deposition techniques, such as chemical vapor deposition (CVD) and atomic layer deposition (ALD), for application of pattern material do not provide uniformity in pattern shape owing to a faster rate of deposition of material at an upper portion of the pattern as opposed to a lower portion of the pattern, thereby causing non-uniformity. Additionally, CVD and ALD require high temperatures and are costly.

Accordingly, in some embodiments, the present disclosure is directed to a process for the fabrication of a semiconductor device in which a self-assembled monolayer (SAM) is used to form a patterned surface.

Figure 1:
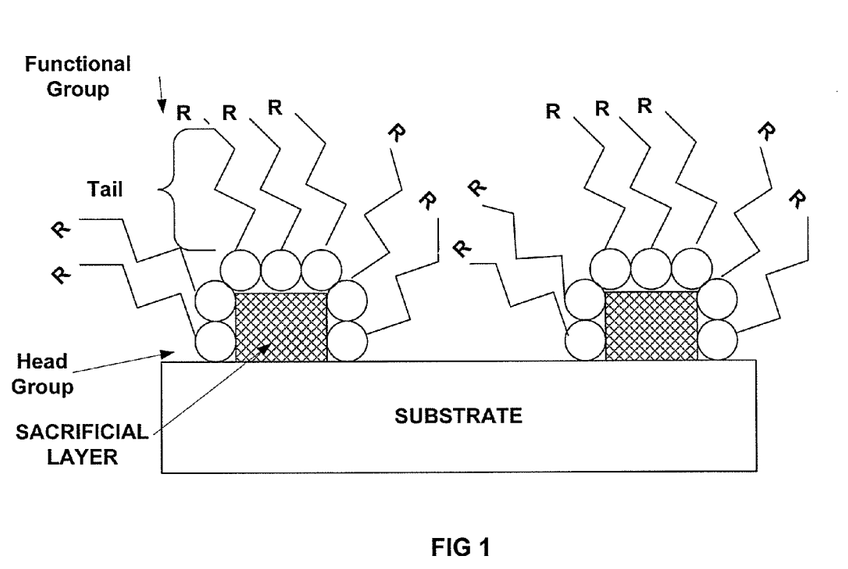
FIG. 1 is an illustration of an embodiment of a representation of a monolayer structure.

In FIG. 1 there is illustrated a representation of a SAM which has been deposited on a sacrificial metal layer overlying a semiconductor substrate. The SAM comprises an organized layer of amphiphilic molecules in which one end of the molecule, the "head group" shows a specific, reversible affinity for a substrate. Generally, the head group is connected to an alkyl chain in which a tail or "terminal end" can be functionalized, for example, to vary wetting and interfacial properties. In one embodiment, the terminal end is functionalized to improve etch selectivity. Further, the carbon chain length $(C-C)^n$ of the alkyl chain will, in one embodiment, be adjustable to define critical dimension, for example, to increase or decrease a width of the pattern.

Selection of the head group will depend on the application of the SAM, with the type of SAM compounds based on the substrate utilized. The head group may comprise, in one embodiment, an organosulfur compound, for example, dinalkyl sulfide, di-n-alkyl disulfides, 3 thiophenols, mercaptopyridines, mercaptoanilines, thiophenes, cysteines, xanthates, thiocarbaminates, thiocarbamates, thioureas, mercaptoimidazoles, alkanethiols, and alkaneselenols. In one embodiment, the head group comprises a thiol, a chloride, or a fluoride. Substrates can include, for example, planar surfaces, such as silicon and metals, including copper, iron, silver, gold, nickel, platinum, palladium, and stainless steel; or curved surfaces, such as nanoparticles. In one embodiment, the substrate comprises a metal sacrificial layer.

FIGS. 2A-2I show a series of cross-sectional views illustrating an embodiment of a method of forming a semiconductor device. The process steps and structures below do not form a complete process flow for manufacturing integrated circuits and/or semiconductor devices. The invention can be practiced in conjunction with integrated circuit fabrication techniques currently used in the art, and only so much of the commonly practiced process steps are included as are necessary for understanding the invention. For purposes of understanding and clarity, this series of cross-sectional views has been streamlined in that other embodiments may include additional steps, and not all illustrated steps are present in all manufacturing flows. Hence, any number of variations are contemplated as falling within the scope of the present disclosure, and the disclosure is not limited to the examples illustrated or described herein.

Figure 2A:
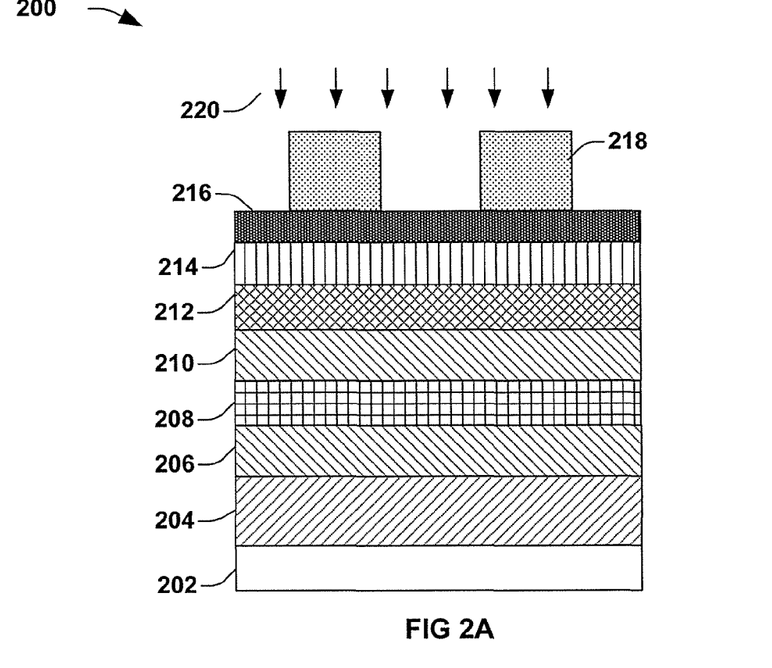
FIGS. 2A-2K illustrate a cross-sectional view of a method for forming a semiconductor device in accordance with an embodiment described herein.

Turning to FIG. 2A, there is illustrated a portion of a cross-section of a semiconductor wafer having a substrate 202 provided in the form of a bulk silicon wafer. Although FIG. 2A illustrates a bulk silicon wafer substrate, "semiconductor substrate" as referred to herein may comprise any type of semiconductor material including a bulk silicon wafer, a binary compound substrate (e.g., GaAs wafer), a ternary compound substrate (e.g., AlGaAs), or higher order compound wafers, among others. Further, the semiconductor substrate 202 can also include non semiconductor materials such as oxide in silicon-on-insulator (SOI), partial SOI substrate, polysilicon, amorphous silicon, or organic materials, among others. In some embodiments, the semiconductor substrate 202 can also include multiple wafers or dies which are stacked or otherwise adhered together. The semiconductor substrate 202 can include wafers which are cut from a silicon ingot, and/or any other type of semiconductor/non-semiconductor and/or deposited or grown (e.g. epitaxial) layers formed on an underlying substrate.

One or more layers to be patterned may be provided over the substrate 202 to form a patterned surface. The layers may include, for example, a dielectric layer 204, which can comprise a polysilicate glass (PSG), and in some embodiments, is formed on an upper surface of substrate 202. Dielectric layer 204 can be applied, for example, using conventional chemical vapor deposition (CVD), spin-on techniques, or other like processes, and in accordance with embodiments of the invention, can include silicon oxide, silicon nitride, or silicon-oxynitride, among others. Dielectric layer 204 can be, in one embodiment, a low-k dielectric. In an embodiment, dielectric layer 204 is formed of low-k dielectric materials with dielectric constants (k value) between about 2.9 and 3.8, and hence dielectric layer 204 is also a low-k dielectric layers. In other embodiments, dielectric layer is formed of ultra low-k (ULK) dielectric materials, for example, with k values less than about 2.5, and hence dielectric layer 204 is also ULK layer. In yet other embodiments, dielectric layer 204 is formed of extra low-k (ELK) dielectric materials, for example, with k values between about 2.5 and about 2.9, and hence dielectric layer 204 is also ELK layers. Such dielectrics include, for example, carbon-doped silicon dioxide, also referred to as organosilicate glass (OSG) and carbon-oxide. Low-k materials may also include borophosphosilicate glass (BPSG), borosilicate glass (BSG), and phosphosilicate glass (PSG), among others. Transition layers 206, 210, overly dielectric layer 204 and function to promote adhesion between dielectric layer 204 and a subsequently formed sacrificial layer 212. A conductive layer 208 comprising, for example, aluminum, copper, molybdenum, tantalum, titanium, tungsten, alloys, nitrides or silicides of such metals, may further be included.

The layers to be patterned can be formed by various techniques, for example, CVD such as plasma-enhanced CVD, low pressure CVD or epitaxial growth, physical vapor deposition (PVD) such as sputtering or evaporation, or electroplating, or other techniques. The thickness of the one or more layers to be patterned will vary depending on the materials and particular devices being formed.

Depending on the particular layers to be patterned, film thicknesses and photolithographic materials and process to be used, it may be desirable to dispose over the layers 202-210 a sacrificial layer 212, for example, a hard mask layer, and a bottom 214 and top 216 antireflective coating (ARC) over which a photoresist layer 216 is to be coated. Use of a sacrificial layer 212 may be desired, for example, with thin resist layers, where the layers to be etched require a significant etching depth, and/or where the particular etchant has poor resist selectivity. In one embodiment, where a sacrificial layer 212 is used, the resist patterns to be formed can be transferred to the sacrificial layer which, in turn, can be used as a mask for etching underlying layers. Suitable sacrificial materials can include metals and oxides and nitrides thereof, for example, tungsten, titanium, titanium nitride, titanium oxide, zirconium oxide, aluminum oxide, aluminum oxynitride, hafnium oxide, amorphous carbon, silicon oxynitride and silicon nitride.

One or more antireflective coating layers 214, 216 may be desirable where the substrate 202 and/or underlying layers would otherwise reflect a significant amount of incident radiation during photoresist exposure such that the quality of the pattern formed would be adversely affected. Such coatings can improve depth of focus, exposure latitude, linewidth uniformity and CD control. Suitable antireflective materials including but not limited to: (1) organic anti-reflective coating (ARC) materials, such as but not limited to amorphous carbon anti-reflective coating (ARC) materials and organic polymer anti-reflective coating (ARC) materials (such as but not limited to polyimide organic polymer anti-reflective coating (ARC) materials, polysulfone anti-reflective coating (ARC) materials); and (2) silicon containing dielectric anti-reflective coating (ARC) materials, such as but not limited to silicon oxide anti-reflective coating (ARC) materials, silicon nitride anti-reflective coating (ARC) materials and silicon oxynitride anti-reflective coating (ARC) materials. In one embodiment, ARC layers 214, 216 formed from the same materials. In another embodiment, ARC layers 214, 216 can be formed from different materials.

Figure 2B:
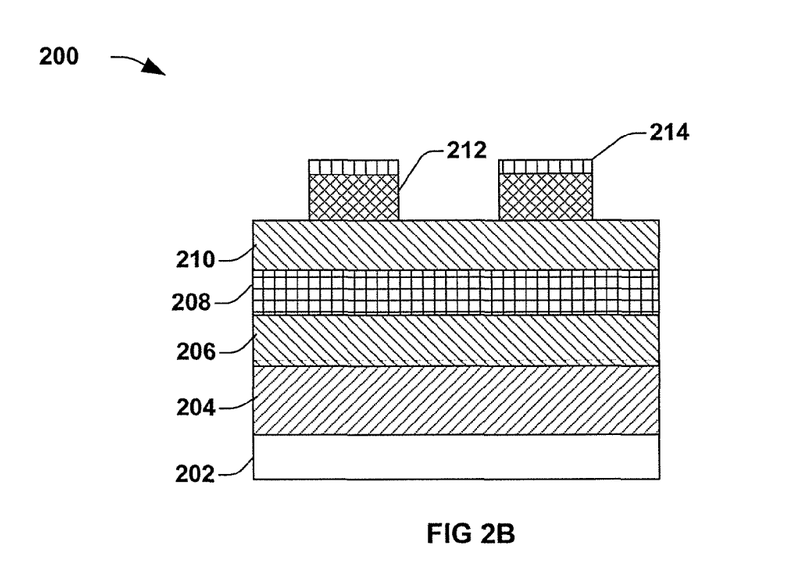

A photoresist layer 218 is applied on the substrate 202 over the antireflective layers 214, 216 and the sacrificial layer 212 is patterned 220. During patterning 220, the photoresist layer 218 and top ARC layer 216 are consumed, leaving a portion of the bottom ARC layer 214 over the remaining sacrificial layer 212, as illustrated in FIG. 2B. The bottom ARC layer 214 is then removed by an ashing process, as is generally known in the art. Removal of the bottom ARC layer 214 leaves a freestanding exposed patterned sacrificial layer 112.

Figure 2C:
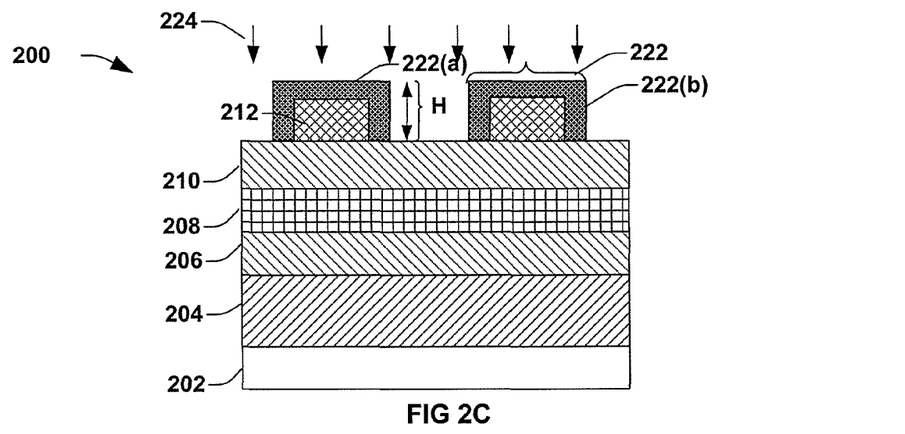

A self-assembled monolayer (SAM) is deposited 224 over the patterned sacrificial layer 212 to form a SAM cap 222(a) over an upper surface of the patterned sacrificial layer 212 and forming SAM sidewalls 222(b) about the sidewalls of the patterned sacrificial layer 212, as illustrated in FIG. 2C. The SAM is created by chemisorption of the hydrophilic head groups onto the sacrificial layer 212, followed by a slow two-dimensional organization of hydrophobic tail groups. SAM adsorption can occur from solution by immersion of the substrate into a dilute solution of, in one embodiment, an alkane thiol in ethanol. Adsorption may also occur from a vapor phase. The adsorbed molecules initially form a disordered mass of molecules, and instantaneously begin to form crystalline or semicrystalline structures on the sacrificial layer 212 in a first monolayer. Owing to the affinity of the head group of the SAM to the metal of the sacrificial layer 212, the SAM will selectively deposit on the sacrificial layer 212, forming a metal complex and the SAM will not react with a nitride transition layer 210 on which the sacrificial layer 212 is directly disposed. The SAM may be deposited via spin-coating from a solution of, for example, an alkane thiol in ethanol, among others. The SAM can be formed, in one embodiment, at a thickness of about 16 nm so that SAM cap 222(a) and SAM sidewalls 222(b) are of equal thickness. It will be understood, however, that SAM thickness can be adjusted by adjusting the carbon chain length of the alkyl chain of the SAM.

Figure 2D:
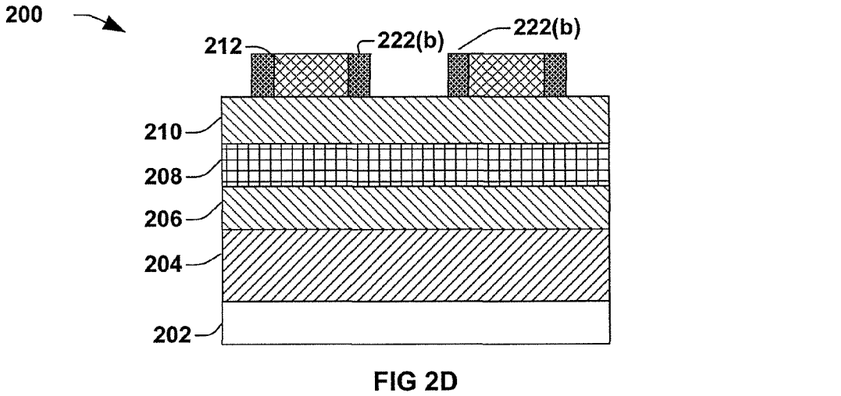
Figure 2E:
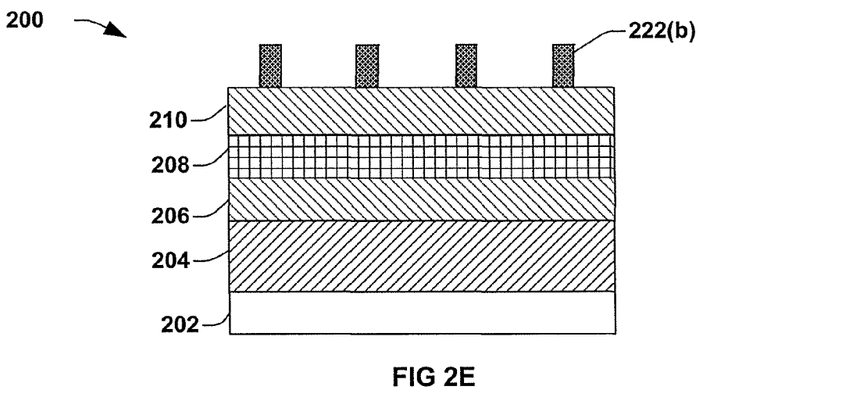

Following deposition of the SAM 222, an etch is performed to remove the cap 222(a) portion of the SAM overlying the sacrificial layer 212 to expose the upper surface of the patterned sacrificial layer 212 so that only SAM sidewalls 222(b) remain in place, as illustrated in FIG. 2D. Height (H) of the sidewalls 222(b) is dependent upon the height of the sacrificial layer and can be adjusted accordingly. In one embodiment height (H) can be about 330 A°. Following removal of the SAM cap 222(b), the patterned sacrificial layer 212 can be removed as by an etch or wet strip process (not shown), with the SAM sidewalls 222(b) then forming a first pattern arrangement which has been directed by the patterned sacrificial layer 212, as illustrated in FIG. 2E.

Figure 2F:
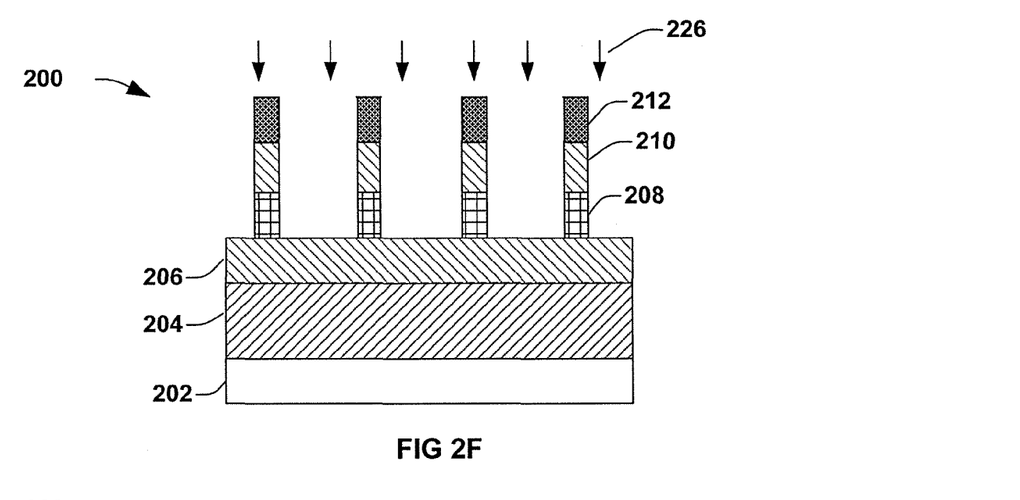
Figure 2G:
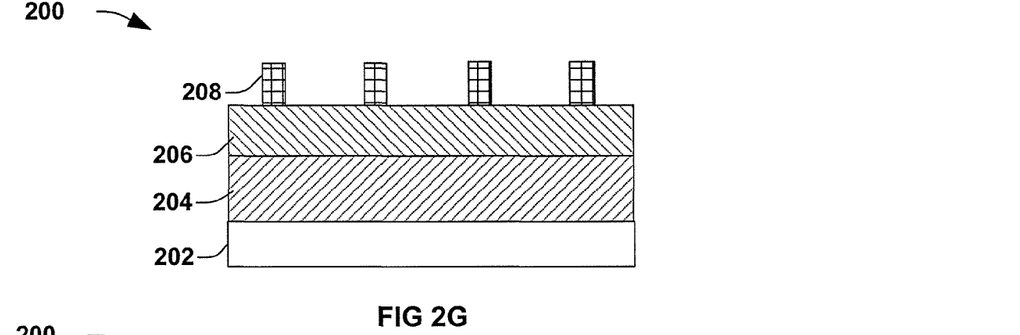

An etch process 226 is next performed in FIG. 2F to removed conductive layer 208 and is stopped at transition layer 206. Transition layer 210 and first pattern arrangement 222(b) are then removed by an etch process form a second pattern directed by the first pattern arrangement 222(b) in FIG. 2G.

Figure 2H:
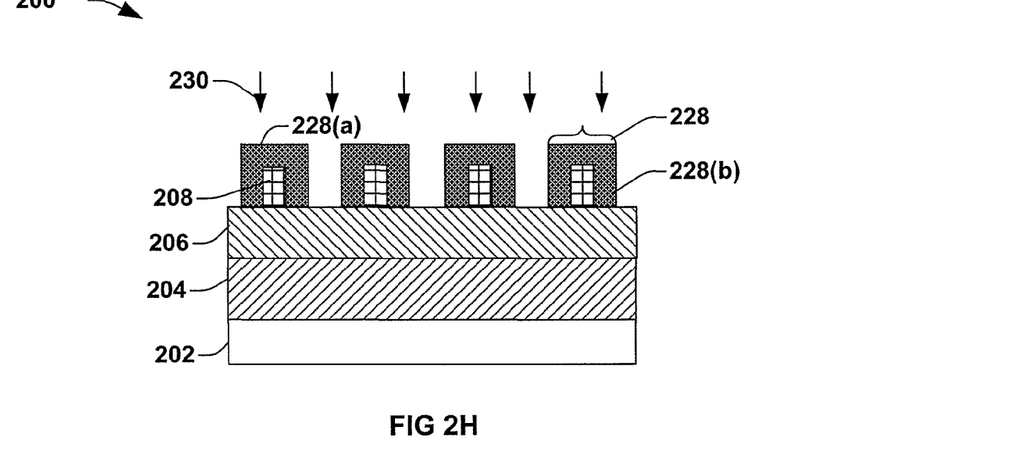

In FIG. 2H, a second or additional self-assembling monolayer 228 is deposited 230 over the second pattern formed by the conductive layer 208 to form a SAM cap 228(a) over an upper surface of the conductive layer 208 and to form SAM sidewalls 228(b) about sidewalls of the conductive layer 208.

Figure 2I:
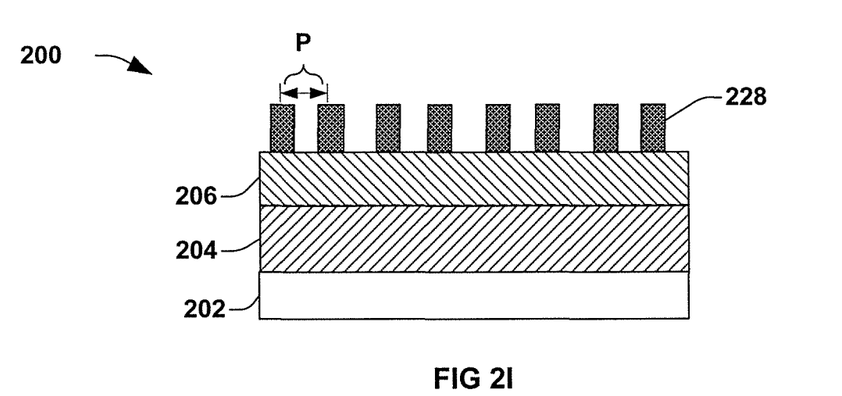

Following deposition of the second SAM monolayer 228, the cap portion 228(a) is removed, exposing an upper surface of the second pattern formed by the conductive layer 208, leaving the SAM sidewalls 228(b) in place to form a second pattern arrangement of 228, directed by the pattern created by the first pattern arrangement of as illustrated in FIG. 2I.

Figure 2J:
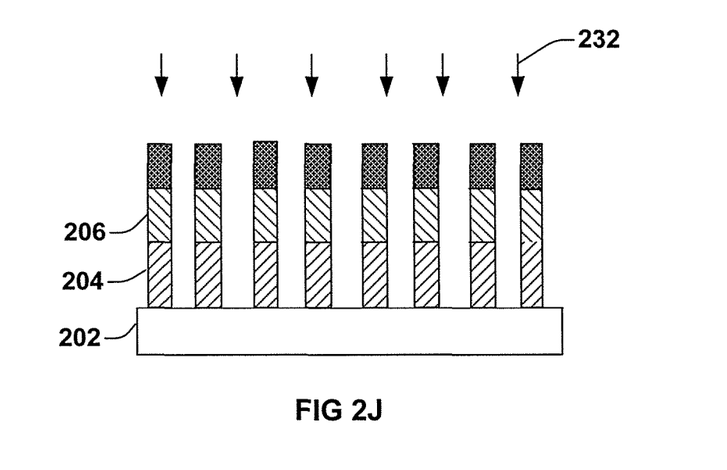
Figure 2K:
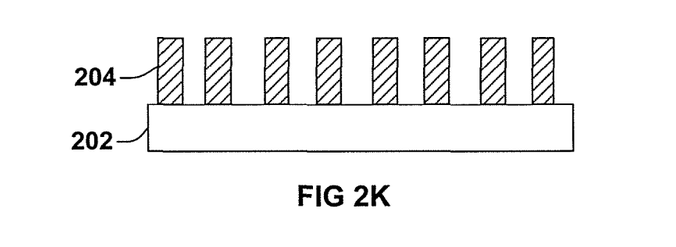

In FIG. 2J, an etch process 230 is performed to remove transition layer 206 and pattern dielectric layer 204. Patterning process is completed in FIG. 2K, with dielectric layer 204 remaining.

Owing to the process disclosed herein, the semiconductor device 200 of FIG. 2I is provided with a second pattern arrangement which has a pitch of one-half of the first pattern arrangement. Thus, for example, beginning with a pitch (P) of 128 nanometers (nm) in FIG. 2A, the pitch can be reduced by one-half in the first pattern arrangement to 64 nm P in FIG. 2E. The pitch of the second pattern arrangement is then reduced by one-half to 32 nm (P) in FIG. 2. It will be understood, then, that it is within the scope of the present disclosure to deposit additional self-assembled monolayers to further decrease pitch. The pitch of the spacers can then be approximated by a factor of $\frac{1}{2}^N$ of a minimum feature size on the semiconductor device which was resolved by photolithography, where N is a positive integer.

Figure 3:
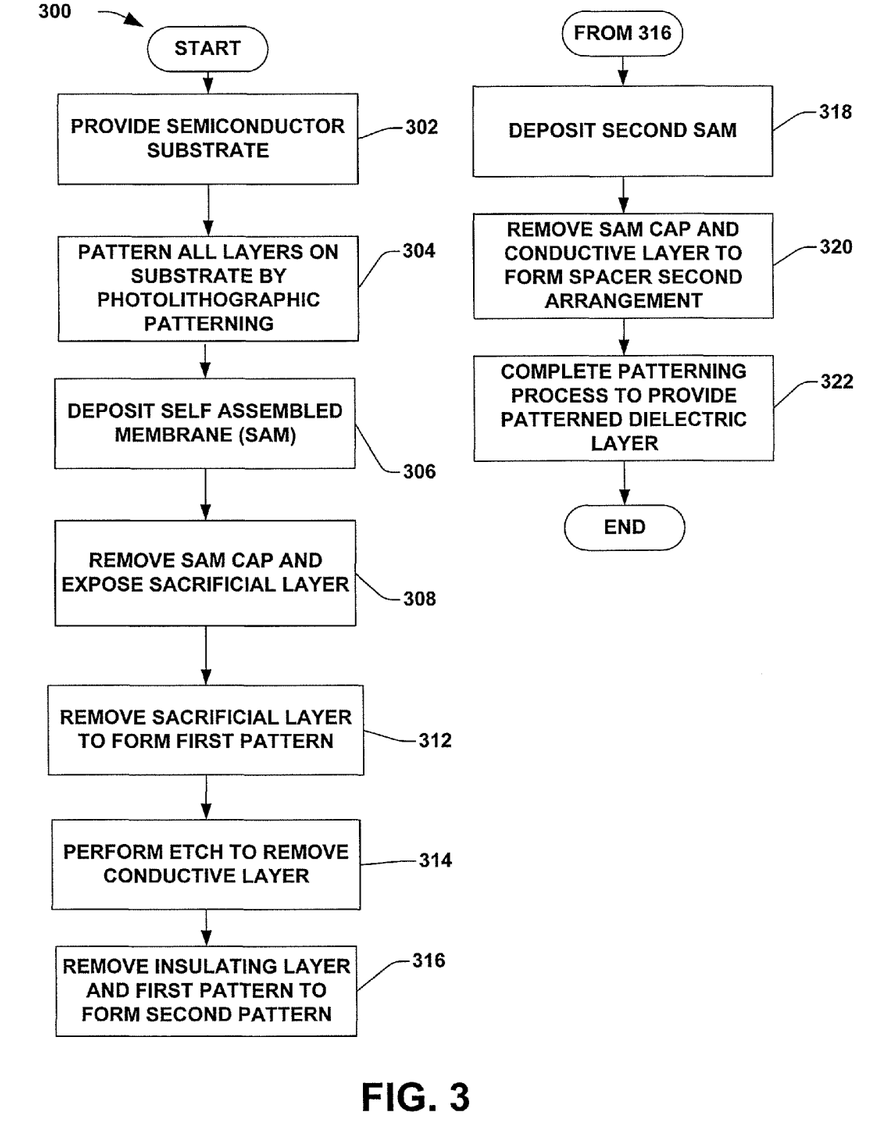
FIG. 3 illustrates a flow diagram of a method for forming a semiconductor device in accordance with an embodiment described herein.

FIG. 3 illustrates a flow diagram of a method of forming a semiconductor device in accordance with some embodiments of the disclosure. While this method and other methods disclosed herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

As illustrated in FIG. 3, method 300 begins at step 302 wherein a semiconductor substrate is provided having layers thereon to be patterned.

In step 304, photolithographic patterning is performed to pattern layers on the substrate.

A SAM is deposited by spin coating at step 306 over the upper surface and sidewalls of the sacrificial layer to form a SAM cap and SAM sidewalls.

In step 308, the SAM cap is removed and the sacrificial layer is exposed which is then removed by an etch and/or wet strip process to form a first pattern arrangement in step 312

The conductive layer is then patterned by etching, utilizing the first pattern arrangement in step 314.

The transition layer and first pattern are removed by step 316. In step 318 a second SAM is deposited over the upper surface and sidewalls of the conductive layer to form a SAM cap and SAM sidewalls.

The SAM cap and the conductive layer are then removed in step 320 by an etch and/or wet strip process to form a second arrangement. The patterning process is then completed in step 320 by etching of the transition layer into the low-k dielectric to pattern the dielectric layer, and the process ends.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the disclosure relates to a process for the formation of a semiconductor device by providing a semiconductor surface with a patterned surface thereon. The process further comprises depositing a first monolayer of a SAM over the patterned surface to form a first pattern arrangement and then depositing a second monolayer of a SAM to form a second pattern arrangement.

In another embodiment, the disclosure relates to a method for forming a spacer on a semiconductor substrate. The method comprises providing a semiconductor substrate having a patterned sacrificial layer thereon. The method further comprises depositing a SAM over an upper surface and sidewalls of the patterned sacrificial layer to form a SAM cap and SAM sidewalls, and then removing the SAM cap and patterned sacrificial layer to form a first arrangement in a first pattern.

In a still further embodiment, the disclosure relates to a method of forming a pattern on a semiconductor device which includes a semiconductor substrate having a patterned surface with features defined by a first pitch. The method further comprises forming an arrangement of a self-assembled monolayer. The self-assembled monolayer includes a head group comprising a thiol, at chloride or a fluoride, and a functionalized tail group. The arrangement of the self-assembled monolayer provides features having a second pitch that is reduced by one-half of the first pitch.

What is claimed is:

1. A method for forming a pattern on a semiconductor substrate comprising:
   providing a semiconductor substrate that includes a patterned sacrificial layer, the patterned sacrificial layer overlying a layer stack, comprising:
     a target layer overlying the semiconductor substrate;
     a first transition layer overlying the target layer;
     an intermediary layer overlying the first transition layer;
     a second transition layer overlying the intermediary layer; and
     the patterned sacrificial layer overlying the second transition layer;
   forming a first self-assembled monolayer (SAM) over the patterned sacrificial layer to form a first SAM cap over an upper surface of the patterned sacrificial layer and to form first SAM sidewalls about sidewalls of the patterned sacrificial layer;

removing the first SAM cap to expose the upper surface of the patterned sacrificial layer while leaving the first SAM sidewalls in place;

after the first SAM cap has been removed, removing the patterned sacrificial layer such that the first SAM sidewalls form a first pattern arrangement;

patterning the second transition layer and the intermediary layer using the first SAM sidewalls as an etch mask, thereby defining pillars comprising intermediary layer portions, second transition layer portions, and first SAM caps;

removing the first SAM caps and second transition layer portions, and leaving intermediary portions overlying the first transition layer;

forming a second self-assembled monolayer (SAM) over the intermediary portions after removing the first SAM caps to form a second SAM cap over an upper surface of the intermediary portions and to form second SAM sidewalls about sidewalls of the intermediary portions;

removing the second cap to expose the upper surface of the intermediary portions while leaving the second SAM sidewalls in place and then removing the intermediary portions such that the second SAM sidewalls form a second pattern arrangement; and patterning the first transition layer and the target layer using the second SAM sidewalls as an etch mask, wherein the patterned target layer comprises the pattern or the semiconductor substrate.

2. The method of claim 1, wherein the patterned target layer comprises a second arrangement, and wherein the second arrangement has a pitch of one-half of the first arrangement.

3. The method of claim 1, wherein the sacrificial layer comprises a metal and a head group of the self-assembled monolayer is specific to the metal.

4. The method of claim 3, wherein the self-assembled monolayer comprises a head group of a thiol, a chloride or a fluoride.

5. The method of claim 1, wherein the patterned sacrificial layer is disposed directly on the second transition layer, and wherein the second transition layer comprises a nitride transition layer.

6. The method of claim 5, wherein the first SAM, when deposited, selectively deposits on the sacrificial layer without forming on the nitride transition layer.

7. The method of claim 6, wherein the sacrificial layer is a metal layer and wherein the first SAM comprises a head group of a thiol, a chloride or a fluoride.

8. A method of forming a pattern on a semiconductor substrate, comprising:

forming a patterned sacrificial layer overlying an intermediate layer stack, wherein the intermediate layer stack overlies the semiconductor substrate;

forming a first self-assembled monolayer (SAM) on sidewalls of the patterned sacrificial layer;

removing the patterned sacrificial layer while leaving the first SAM sidewalls in place, wherein the first SAM sidewalls define a first pattern arrangement;

patterning at least one layer of the intermediate layer stack using the first SAM sidewalls as a first etch mask to form pillars in the at least one layer of the intermediate layer stack and then removing the first SAM sidewalls;

forming a second self-assembled monolayer (SAM) on sidewalls of the pillars after the first SAM sidewalls are removed; and removing the pillars while leaving the second SAM sidewalls in place such that the second SAM sidewalls define a second pattern arrangement.

9. The method of claim 8, further comprising patterning at least one other layer of the intermediate layer stack using the second SAM sidewalls as a second etch mask.

10. The method of claim 8, wherein a pitch of the second pattern arrangement is twice a pitch of the first pattern arrangement.

11. The method of claim 8, further comprising forming first SAM top portions on top of the patterned sacrificial layer concurrently with the forming of the first SAM sidewalls, thereby defining first SAM caps on top of the patterned sacrificial layer.

12. The method of claim 11, further comprising removing the first SAM caps prior to removing the patterned sacrificial layer.

13. The method of claim 8, further comprising forming second SAM top portions on top of the pillars concurrently with the forming of the second SAM sidewalls, thereby defining second SAM caps on top of the pillars.

14. The method of claim 13, further comprising removing the second SAM caps prior to removing the pillars.

15. A method of forming a pattern on a semiconductor substrate, comprising:

forming a first self-assembled monolayer (SAM) sidewalls over an intermediate layer stack, wherein the first SAM sidewalls define a first pattern arrangement;

patterning at least one layer of the intermediate stack using the first SAM sidewalls as a first etch mask to form pillars in the at least one layer of the intermediate stack and then removing the first SAM sidewalls;

forming second self-assembled monolayer (SAM) sidewalls on sidewall portions of the pillars after the first SAM sidewalls are removed; and removing the pillars while leaving the second SAM sidewalls, wherein the remaining second SAM sidewalls define a second pattern arrangement.

16. The method of claim 15, further comprising patterning at least one other layer of the intermediate layer stack using the second SAM sidewalls as a second etch mask.

17. The method of claim 15, wherein a pitch of the second pattern arrangement is twice a pitch of the first pattern arrangement.

18. The method of claim 15, further comprising forming a patterned sacrificial layer over the intermediate layer stack, wherein forming the first SAM sidewalls comprises forming first SAM top portions on top of the patterned sacrificial layer while concurrently forming of the first SAM sidewalls on sidewalls of the pattern sacrificial layer, thereby defining first SAM caps on top of the patterned sacrificial layer.

19. The method of claim 18, further comprising removing the first SAM caps prior to removing the patterned sacrificial layer.

20. The method of claim 15, further comprising forming second SAM top portions on top of the pillars concurrently with the forming of the second SAM sidewalls, thereby defining second SAM caps on top of the pillars, and then removing the second SAM caps prior to removing the pillars.

* * * * *